United States Patent [19]

Berrier et al.

[11] Patent Number: 5,304,458
[45] Date of Patent: Apr. 19, 1994

[54] MULTIBLOCK COPOLYMERS FOR FLEXOGRAPHIC PRINTING PLATES

[75] Inventors: Arthur L. Berrier; Rustom S. Kanga, both of Ellicott City, Md.

[73] Assignee: W. R. Grace & Co.-Conn., New York, N.Y.

[21] Appl. No.: 941,486

[22] Filed: Sep. 8, 1992

[51] Int. Cl.$^5$ ............... G03C 1/68; G03C 1/72; G03F 7/004; G03F 7/028
[52] U.S. Cl. .................. 430/281; 430/291; 430/286; 430/300; 430/302; 430/306; 430/907; 522/107; 522/110; 522/121
[58] Field of Search ............ 430/371, 281, 286, 300, 430/306, 302, 907; 522/107, 110, 121

[56] References Cited

U.S. PATENT DOCUMENTS

| | | | |
|---|---|---|---|
| 3,567,798 | 7/1971 | Haefele et al. | 525/280 |
| 3,639,523 | 8/1972 | Hayter et al. | 525/280 |
| 3,766,300 | 10/1973 | De La Mare et al. | 525/338 |
| 3,891,721 | 4/1975 | Prudence | 525/271 |
| 4,045,231 | 8/1977 | Toda et al. | 430/286 |
| 4,162,919 | 7/1979 | Richter et al. | 430/271 |
| 4,179,531 | 2/1979 | Hein | 430/300 |
| 4,245,027 | 1/1981 | Takeda et al. | 430/286 |
| 4,271,259 | 6/1981 | Breslow et al. | 430/286 |
| 4,272,610 | 6/1981 | Breslow et al. | 430/286 |
| 4,323,637 | 9/1982 | Chen et al. | 430/271 |
| 4,430,417 | 10/1984 | Heinz et al. | 430/286 |

OTHER PUBLICATIONS

Morrison et al. Organic Chemistry, 3rd Ed. p. 456 (1973).
Boucher et al., "Kinetics and Mechanism of the Quaternization of Poly (4-vinylpyridine) with Ethyl, n-Propyl, n-Butyl, n-Hexyl and Benzyl Bromide in Sulfolane", J. Chem. Society, Faraday Trans. I. 73, 1629-1635 (1977).
Chem. Abstracts 88 (2) 75242, Fielding—Russell et al. (1977).
Chem. Abstracts 101 (6) 39114u, Kudose et al. (1984).
Chem. Abstracts 103 (20) 166031f, Lelah et al. (1985).
Jacovic, M. S., "Ionomer-like Materials based on 4-vinylpyridine Copolymrs", Makromol. Chem., Rapid Commun., 10, 217-225, especially at 219-220 (1989).
Chem. Abstracts 104 (20) 169705k. Y. Miyaki (1985).
Chem. Abstracts 109 (10) 74182b, Shimazaki et al. (1988).
Chem. Abstracts 111 (6) 39978k, Moeller et al. (1989).
Chem. Abstracts 111 (16) 134883, Ohnuma et al. (1989).
Soum et al., "Synthesis and Characterization of New Block Copolymers of Butadiene and 2-isopropenylpyridine", Polymer, 29, 1528-1534 (Aug., 1988).

Primary Examiner—John Kight, III
Assistant Examiner—P. Hampton-Hightower
Attorney, Agent, or Firm—Valerie E. Looper

[57] ABSTRACT

Flexographic photosensitive printing plates are made with formulations comprising block polymers having an architecture of BA, CBA or CBCA, where A is poly(vinylpyridine), B is poly(butadiene) or poly(isoprene) and C is styrene. The polymers may be quaternized or neutralized with an organic acid. When made with quaternized polymers, the plates after imaging with UV may be developed in aqueous solutions. The block polymers offer further advantages as to ease of synthesis, safety and improved resolution.

6 Claims, No Drawings

MULTIBLOCK COPOLYMERS FOR FLEXOGRAPHIC PRINTING PLATES

FIELD OF THE INVENTION

This invention relates to radiation curable polymer formulations, as well as photosensitive articles having solid surfaces or layers prepared from such formulations. The invention also relates to various types of asymmetric block copolymers found to be useful in making such formulations. These block copolymers exhibit improved physical properties over similar random copolymers.

BACKGROUND OF THE INVENTION

Block copolymers are known to be useful in a variety of contexts. For example, U.S. Pat. No. 3,766,300, issued to De La Mare Oct. 16, 1973 discloses the rapid hydrogenation of copolymers prepared from conjugated dienes and polar monomers such as vinylpyridines, which are said to be useful as compatibilizers or polydispersants.

U.S. Pat. No. 3,891,721 issued to Prudence Jun. 24, 1975 discloses block polymers having the architecture C-B-A where C is styrene, B is butadiene and A is 2-vinylpyridine. There is no mention of polyisoprene midblocks. These polymers are said to have high tensile strength.

U.S. Pat. No. 3,567,798 issued to Haefele et al. Mar. 2, 1971 relates to block copolymers with a configuration C-B-C-A where C is a relatively low molecular weight vinyl arene block (4,000–20,000 mw), B is a conjugated diene in which the molecular weight is not critical (5,000–200,000 mw) and A is 1–100 units of a monomer which can be a monovinylpyridine, (meth)acrylic acid ester, (meth)acrylonitrile, monovinylquinoline or acrylamide. Again, tensile strength is said to be improved.

U.S. Pat. No. 3,639,523 issued to Hayter et al. Feb. 1, 1972 relates to adhesives having improved green strength, building tack, solvent resistance and high temperature stability. The architecture of the disclosed polymer is A-C-B-C-A where A is vinylpyridine, B is a conjugated diene, and C is a monovinyl arene. None of the above references disclose or suggest the use of these polymers as radiation curable materials.

Triblock copolymers having poly(4-vinylpyridine) end blocks and a polybutadiene center block can be prepared by sequential anionic polymerization of butadiene and of 4-vinylpyridine using an organolithium initiator; see M. S. Jacovic, "Ionomer-like materials based on 4-vinylpyridine copolymers," Maromol. Chem., Rapid Commun, Vol. 10, 217–225 (1989).

Quaternization of triblock polymers of polystyrene-polybutadiene-polyvinylpyridine is disclosed by Ohnuma et al. in Chemical Abstracts, 111(16):134883 (1989).

Quaternization of poly(4-vinylpyridine) is known: Boucher et al., "Kinetics and Mechanism of the Quaternization of Poly(4-vinylpyridine) with Ethyl, n-Propyl, n-Butyl, n-Hexyl and Benzyl Bromide in Sulfolane", J. Chem. Soc. Faraday Trans. I, 73, pp. 629–1635 (1977).

Diblock and triblock copolymers of butadiene and 2-isopropenylpyridine have been synthesized by anionic polymerization, using a difunctional lithium initiator: Soum et al., "Synthesis and Characterization of New Block Copolymers of Butadiene and 2-isopropenylpyridine," Polymer, vol. 29, pp. 1528–1534 (August, 1988).

Triblock copolymers of polystyrene-polybutadiene (or polyisoprene)-polystyrene have been used in the preparation of photosensitive printing plates: U.S. Pat. No. 4,323,637, Chen et al., "Use of Cover Sheet and Interposed Flexible Film with Block Copolymer Compositions" (1982). The copolymers were not quaternized, nor were the resulting formulations water-developable.

U.S. Pat. No. 4,162,919, Richter et al. (1979), discloses a 2-block copolymer of styrene-isoprene (or butadiene) for use in flexographic printing plates.

U.S. Pat. No. 4,245,027, Takeda et al. (1981), discloses a photosensitive composition comprising copolymers of vinylpyridine and a polyvinylidene halide, optionally with an olefin, e.g., butadiene or isoprene, plus a light sensitizing element, e.g., iodoform, quinones, or diazonium salts, capable of forming a quaternary salt with the polyvinylpyridine on heating or on exposure to actinic light. The instant invention differs, inter alia, in that the triblock copolymer has no polyvinylidene halide component, and further in that it is quaternized prior to formulation and exposure.

U.S. Pat. Nos. 4,271,259 and 4,272,610, both to Breslow et al. (1981), disclose a copolymer of butadiene or isoprene with vinyl pyridine as a component in a photosensitive composition. The copolymer is not specified as ABA, and it is not quaternized. The composition requires an oxidizable component containing allylic hydrogen and a photooxygenation sensitizer.

U.S. Pat. No. 4,430,417, Heinz et al. (1984), discloses ABA triblock copolymers in making flexographic printing plates. A is styrene-butadiene, B is isoprene U.S. Pat. No. 4,179,531, Heinz (1979), discloses ABA triblock copolymers ("Kraton"®—Shell Chemical Co.) in making printing plates where A is a styrene and B is a diene such as isoprene or butadiene. A polythiol is required in the formulation.

U.S. Pat. No. 4,045,231, Toda et al. (1977), discloses a styrene-butadiene-styrene triblock copolymer in a printing plate formulation.

Chem. Abstracts 111(6):39978k, Moeller et al., discloses iodine doped AB diblock copolymers of poly(2-vinylpyridine) and either polybutadiene or polystyrene.

Chem. Abstracts 109(10):74182b, Shimazaki et al., discloses triblock copolymer, polystyrene-polyisoprene-poly(vinylpyridine) quaternized with chloromethylstyrene. Use in photosensitive compositions is not disclosed.

Chem. Abstracts 104(20):169705k, Y. Mihaki, discloses isoprene-styrene-4-vinylbenzyldimethylamine block copolymers treated with di-iodopropane to prepare an amphoteric ion exchanger.

Chem. Abstracts 103(20):166031f, Lelah et al., discloses quaternization of triblock poly(styrenebutadiene-4-vinylpyridine), with crosslinking of the butadiene segment and sulfonation of the styrene block.

Chem. Abstracts 101(6):39114u, Kudose et al., discloses quaternizing triblock butadiene-styrene-4-vinylpyridine copolymer with methyl bromide.

Chem. Abstracts 88(2):75242, Fielding-Russell et al., discloses HCl quaternization of butadiene-styrene-2-vinylpyridine block copolymer.

Copending U.S. Ser. No. 729,976, filed Jul. 15, 1991, describes the use of ABA triblock copolymers of vinylpyridine-isoprene-vinylpyridine and their corresponding quaternized block copolymers as flexographic printing plates developable in aqueous surfactant systems. It was seen that the quaternized block copolymers were hazy. It was later found that neutralization of the vinylpyridine blocks with a strong acid such as trifluoroacetic acid led to clear, non-hazy thick plates. Copending U.S. Ser. No. 868,062, filed Jul. 15, 1991, is a continuation-in-part of U.S. Ser. No. 729,976 which discloses the manufacture and use of those acid neutralized triblock copolymers. Both applications are incorporated herein by reference as if set forth in full.

SUMMARY OF THE INVENTION

It is an object of the invention to prepare flexographic printing plates using formulations comprising multiblock polymers of the type BA, CBA or CBCA, preferably where A is a vinylpyridine, B is a diene, and C is a styrene. All of these materials may be substituted or unsubstituted. The structural permutations are well known to those of ordinary skill in the art.

It is also an object of the invention to prepare a new class of neutralized multiblock polymers of the structure BA', CBA' or CBCA', where:

A' is a neutralized poly(vinylpyridine) consisting of repeating segments of the structure

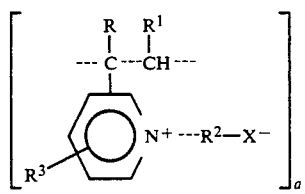

B is a poly(alkadiene) consisting of repeating segments of the structure

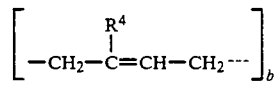

C is either a polystyrene consisting of repeating segments of the structure

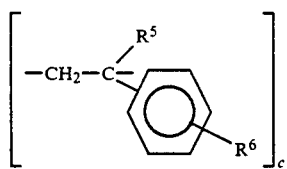

or a (meth)acrylate consisting of repeating segments of the structure

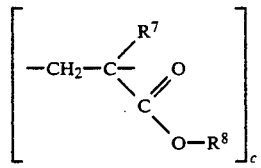

X is a leaving group;
$R$, $R^1$, $R^3$, $R^4$, $R^5$, $R^6$ and $R^7$ are independently H or 1-8 carbon-alkyl;
$R^2$ is H, 1-8 carbon alkyl, or aralkyl;
$R^8$ is $C_1$-$C_8$ alkyl;
a has a value in the range of about 50–5,000;
b has a value in the range of about 500–10,000;
and c has a value in the range of about 25 to 500.

A' may be neutralized or quaternized and is preferably the reaction product of A and organic acids such as alkyl sulfonic acid, substituted acetic acid, substituted benzoic acid, or substituted benzene or aryl sulfonic acid. Inorganic acids such as hydrochloric, sulfuric, phosphoric acids etc. are also usable. The preferred organic acids are trifluoroacetic acid, p-toluene sulfonic acid and o-nitrobenzoic acid. The preferred inorganic acids are hydrochloric acid and sulfuric acid.

It is a further object of the invention to prepare a photosensitive flexographic printing plate using the aforesaid multiblock polymers.

It is also an object to prepare a water-developable printing plate.

Another object is to prepare a thermoplastic elastomeric block polymer designed with a hydrophilic terminal block and which has good physical properties and water dispersibility.

Another object is to provide a more efficient reaction to make a thermoplastic elastomeric block polymer, and also one that uses less toxic chemicals.

Yet another object of this invention is to provide a clear, colorless thermoplastic elastomeric block polymer useful for making flexographic printing plates.

A further object is to provide a block polymer or prepolymer with a block which is a polymer of high enough molecular weight to provide elastomeric behavior, and where the terminal blocks provide water washability to the resultant block polymer.

The term "leaving group" is used in the conventional sense, e.g., as explained in Morrison and Boyd, Organic Chemistry, Third Ed., published by Allyn and Bacon, Inc., p. 456 (1973). As there described, alkyl halides typically react readily in nucleophilic substitutions, e.g., "R:X+:Z⁻→R:Z+:X⁻ where :Z is a nucleophilic reagent (such as vinyl pyridine), R:Z is (in such case) neutralized or quaternized vinylpyridine, and X is the leaving group. Although in the instant publication X can be an organic acid halide (F, Cl, Br, I), $R^2X$ can be any compound containing a leaving group, e.g. $R^2$-methane sulfonate; $R^2$-trifluoroacetate; $R^2$-trifluoromethane sulfonate; and the like.

Molecular weights are number average and are determined by comparison with a polyisoprene or polystyrene standard of known $M_n$ by the gel permeation chromatography technique.

DETAILED DESCRIPTION OF THE INVENTION

The invention is directed to certain multiblock polymers and their use in making photosensitive printing plates. In a preferred embodiment, the invention includes a novel class of multiblock polymers and their use in making printing plates developable in water.

The vinylpyridine monomer A may be substituted or unsubstituted. There is a preferred isomer, the 2-vinylpyridine configuration. The alternative 4-vinylpyridine configuration is known but the 2-vinylpyridine is less expensive, safer to use, more easily polymerized using the techniques disclosed by the inventors, and it produces a final product which is expected to be more easily extrudable. There is a minimum amount of vinylpyridine needed to ensure water washability of the final product, the exposed printing plate. Preferably 20–40 weight percent of the polymer is vinylpyridine, more preferably 25–35 weight percent.

The poly(alkadiene) monomer B is preferably isoprene or butadiene. The polymer is preferably 50 to 80 weight percent isoprene, more preferably 60-70 percent.

The polymer needs to include at least about 5 weight percent of styrene or (meth)acrylate monomer C, preferably 5 to 15 percent. The overall molecular weight of polymer is preferably about 75,000 to 500,000. If the molecular weight is too low, the flexographic plate is not solid enough before exposure, and it could exhibit cold flow during storage or shipment before use. If the molecular weight is too high, the wash rate of the exposed flexographic plate will be too slow for practical use.

The monomers are converted into polymers by adding a specific type of polymerization initiator to the alkadiene monomer B under known polymerization conditions, allowing the alkadiene monomer B to polymerize, then adding the Vinylpyridine monomer A to the reaction mixture, and allowing it to polymerize as well. The reaction is then stopped or quenched by the addition of water or an alcohol, usually methanol. The type of quencher used is a matter of convenience. The inventors have found that a polymer which produces a flexoplate with better physical characteristics results if the reaction is begun with a styrene monomer C and the initiator, followed by B and then A.

The type of initiator is important in this reaction. The initiator should be one of the monofunctional initiators well known in the art. Examples are the $C_1$-$C_8$ alkyllithiums, preferably secbutyllithium.

The choice of the initiators also depends on a number of factors such as solubility of the initiator in hydrocarbon solvents and the initiating ability of the alkyllithium. Most the the alkyllithiums are known to form aggregates in hydrocarbon solvents. The branched alkyllithiums such as secbutyllithium, tertiarybutyllithium, isobutyllithium, isoamyllithium, etc. are generally more soluble and thus result in more homogeneous initiation. Also initiation of monomers should be more rapid than the propagation of the polymer chain. That way, the initiator is used up rapidly, ensuring that all the chains grow at the same time, resulting in the desirable narrow molecular weight distribution. The branched alkyllithiums are known in the art to initiate much more rapidly than the straight chain alkyllithiums such as n-butyllithium. Thus secbutyllithium is much more preferred than the other alkyllithiums.

The use of separate addition steps is important in this reaction because the end result is a block copolymer. If all the monomers were added to the reaction mixture at once, a random copolymer would be produced.

The advantage of the block copolymers over the corresponding random copolymers of the same monomers is that the physical properties which are superior for certain purposes can be obtained. The block copolymers can be made to take better advantage of the peculiar traits of their individual constituents, while the random copolymers tend to exhibit only blended or average traits. Thus, certain ABA triblock copolymers behave as thermoplastic elastomers, i.e., they are elastomeric at room temperature but could be extrudable and flow at high temperatures above the glass transition of the thermoplastic end blocks. The styrene-isoprene triblock copolymers discussed in U.S. Pat. No. 4,179,531, are an example of such thermoplastic elastomer. The vinylpyridine based triblocks are also thermoplastic elastomers, with the added advantage that they can be further modified and could be made aqueous dispersible. Since the applicants are using these polymers to make water washable printing plates, aqueous dispersibility of the polymer is an important advantage. Synthesis and use of such triblock copolymers is disclosed in copending U.S. Ser. Nos. 729,976 and 868,062, both of which are incorporated herein by reference as if set forth in full.

The ABA triblock copolymers, however, are very difficult to synthesize because a difunctional initiator has to be employed in a non-polar medium to get the desirable high 1,4 configuration of the isoprene midblocks.

Isoprene polymers can exist in two different forms or isomers known as the 1,4 configuration or the 3,4 configuration. In most polymerization reactions, one configuration will predominate over the other, but normally the other will also be present, at least in small amounts. The type of configuration or isomer of the polymer that results can be influenced by the reaction conditions. If the reaction is run in a polar medium, that is, a polar solvent such as tetrahydrofuran ("THF"), the isoprene midblock will predominantly have the less desirable 3,4 configuration. This configuration has an adverse impact on the physical properties of the ultimate product because, among other things, the polymer will not have either the high elongation or resilience needed to make a flexoplate. It is preferred that the isoprene midblock have at least 75% of the 1,4 configuration, and more preferably more than 90%. As a consequence, the polymerization of isoprene is run in a non-polar solvent.

Use of a non-polar solvent can be limiting. For one thing, the preferred initiators such as alkyllithiums are not very compatible with non-polar solvents. It is well known in the literature that alkyllithiums form strong aggregates in non-polar solvents. These aggregates do not disperse evenly in solution and lead to inhomogeneous polymerizations. Quality control of the final product is difficult and physical properties of the polymers vary. Also, the use of difunctional initiators in a non-polar solvent for isoprene polymerization results in high viscosities of the growing isopropenyllithium polymer. This becomes extremely critical at high molecular weights (>125,000).

Moreover, in order to make a water developable flexoplate, it is often desirable to quaternize or neutralize the ABA block copolymers of 2-vinylpyridine-isoprene-2-vinylpyridine. This reaction, too, results in a great increase in viscosity, and in thixotropic behavior. Thixotropic materials show a relatively lower viscosity when they are agitated but a high viscosity when still. The ABA copolymers can be stirred, but once the agitation is stopped, their viscosity rises, often to the point that the copolymer cannot be poured.

The extreme viscosity effects discussed above might be mitigated by use of a monofunctional initiator with sequential addition of each monomer. This is usually the way that styrene-diene-styrene block copolymers are made. However, the styrene-diene-styrene polymers are a special case because the reactivity ratios of the styrene and diene monomers are quite close to each other. That is, these monomers will react in a controllable manner under about the same reaction conditions. For example, styrene which is being polymerized can initiate the polymerization of isoprene. That is, styrene can chain transfer to isoprene. The reverse is also true. As a result, styrene-diene-styrene or diene-styrene-diene copolymers are readily made. This is not the case with the monomers desired for the present invention, such as 2-vinylpyridine and isoprene. Although isoprene chain transfers to 2-vinylpyridine quite readily but 2-vinylpyridine does not chain transfer to isoprene. For that same reason it is not possible to make a vinylpyridine-isoprene diblock copolymer and couple the isoprene ends to make a triblock.

It has been found that polymerization of styrene can be initiated with a monofunctional alkyllithium compound to produce a styryllithium living polymer, and that this styryllithium is capable of initiating polymerization of isoprene. The resulting isopropenyllithium in turn is capable of initiating (or chain transferring to) 2-vinylpyridine. In this manner, a block copolymer having a BA or CBA architecture where C is styrene, B is a diene such as isoprene or butadiene, and A is vinylpyridine, can be produced. Other variations such as CBCA are also possible using the same technique. As in the case of the ABA triblock polymers, these BA, CBA and CBCA polymers can be neutralized. However, the viscosity increases upon neutralization of these asymmetric block polymers are much less noticeable. Thus, one can use a monofunctional initiation of styrene followed by sequential addition of isoprene and 2-vinylpyridine. This method avoids the extremely high viscosities seen in both the synthesis and the neutralization steps.

Another advantage of this synthesis route is that the copolymers, when formulated into a flexoplate are solid, with no cold flow (this means they can be stacked or stored on their sides without warping) and good washability after the flexoplate has been exposed. The washed plates have good resistance to swell by aqueous ink, and they are resilient.

Formulations

For use in printing plates, the invention employs two types of formulations. One type is for solvent casting and uses a solvent. The other is for extrusion and is solvent-free. For solvent casting, the block polymer is dissolved in a solvent for further processing. If the polymer has been quaternized or neutralized, it can be left in the same solvent in which it was quaternized. To this solution is added a photosensitive unsaturated compound (typically an acrylate), and a photoinitiator. This solution can be solvent cast to produce a photopolymer plate, which can then be imaged and developed to produce solid printing plates. Development can be by water and/or solvent.

Thus, a formulation for solvent casting will include:
(1) Multiblock polymer;
(2) A solvent, including those solvents useful in the quaternizing process, e.g., methylene chloride, chloroform, toluene, methanol, benzene, tetrahydrofuran, ethylene chloride, etc.;
(3) A photosensitive unsaturated compound, as described below; and
(4) A photoinitiator, as described below.

The Photosensitive Unsaturated Compound

This material is a reactive monomer, typically an acrylate. Useful acrylates include those of the formula:

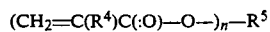

where $R^4$ is H or methyl and $R^5$ is an organic moiety having a valence of n, and n is 1 or more.

Such reactive monomers include, but are not limited to, trimethylolpropane triacrylate, hexanediol diacrylate, 1,3-butylene glycol diacrylate, diethylene glycol diacrylate, 1,6-hexanediol diacrylate, neopentyl glycol diacrylate, polyethylene glycol-200 diacrylate, tetraethylene glycol diacrylate, triethylene glycol diacrylate, pentaerythritol tetraacrylate, tripropylene glycol diacrylate, ethoxylated bisphenol-A diacrylate, trimethylolpropane triacrylate, dimethylolpropane tetraacrylate, triacrylate of tris(hydroxyethyl) isocyanurate, dipentaerythritol hydroxypentaacrylate, pentaerythritol triacrylate, ethoxylated trimethylolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate, diethylene glycol dimethacrylate, 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate, urethanemethacrylate or acrylate oligomers and the like which can be added to the photopolymerizable composition to modify the cured product. Monoacrylates such as cyclohexyl acrylate, isobornyl acrylate, lauryl acrylate and tetrahydrofurfuryl acrylate and the corresponding methacrylates are also operable as reactive diluents.

Photoinitiators

The formulations comprising the novel materials of this invention require a photoinitiator. A large number are available and useful.

Photoinitiators for the photocurable composition include the benzoin alkyl ethers, such as benzoin methyl ether, benzoin ethyl ether, benzoin isopropyl ether and benzoin isobutyl ether. Another class of photoinitiators are the dialkoxyacetophenones exemplified by 2,2-dimethoxy-2-phenylacetophenone, i.e., Irgacure ® 651 (Ciba-Geigy); and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to, benzophenone, acetophenone, o-methoxybenzophenone, acenaphthenequinone, methyl ethyl ketone, valerophenone, hexanophenone, alpha-phenyl-butyrophenone, p-morpholinopropiophenone, dibenzosuberone, 4-morpholinobenzophenone,4'-morpholinodeoxybenzoin, p-diacetylbenzene, 4-aminobenzophenone, 4'-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracene-7-one, 1-naphthaldehyde, 4,4'-bis(dimethylamino)-benzophenone, fluorene-9-one, 1'-acetonaphthone, 2'-acetonaphthone, 2,3-butanedione, acetonaphthene, benz[a]anthracene 7.12 dione, etc. Phosphines such as triphenylphosphine and tri-o-tolylphosphine are also operable herein as photoinitiators.

Other Additives

Other additives to the photocurable composition can be included. To inhibit premature crosslinking during storage of the prepolymer containing compositions of this invention, thermal polymerization inhibitors and stabilizers are added. Such stabilizers are well known in the art, and include, but are not limited to, hydroquinone monobenzyl ether, methyl hydroquinone, amyl quinone, amyloxyhydroquinone, n-butylphenol, phenol, hydroquinone monopropyl ether, phenothiazine and nitrobenzene, and mixtures thereof. Such additives are used in an amount within the range of from about 0.01 to about 2% by weight of the prepolymer. These stabilizers are effective in preventing crosslinking of the prepolymer composition during preparation, processing and storage.

The compositions also may contain up to about 50% by weight of an inert particulate filler which is essentially transparent to actinic light. Such fillers include the organophilic silicas, bentonites, silica and powdered glass. Such fillers can impart desirable properties to the photocurable compositions and reliefs on printing plates containing those compositions.

Summarizing, formulations using the herein described polymers suitably include the following (in parts by weight):

(1) block polymer, optionally quaternized, about 50-99, preferably about 75-95;

(2) Photosensitive unsaturated compound, about 0.1-50, preferably about 0.1-20;

(3) Photoinitiator, about 0.01-5.0, preferably about 0.1-3.0.

Additionally the formulation contains enough solvent to dissolve the above materials.

For extrusion, the solvent in omitted.

Preparation of Plate

The photocurable compositions comprising the multiblock polymer can be shaped and formed as a solid layer of suitable thickness according to conventional solvent casting, i.e., dissolving the composition in a solvent, shaping the solution into a film or plate, and removing the solvent, e.g., by oven-drying. Alternately, conventional extrusion calendaring or hot press techniques can be used. Solid layers of the photosensitive composition in the form of a film can be adhered to supports such as those comprising polyester, nylon, or polycarbonate. Other suitable supports include woven fabrics and mats, e.g., glass fiber fabrics or laminated materials made of, for example, glass fibers and plastics; and steel or aluminum coated plates. It is preferred that the supports be dimensionally stable and resistant to the washout solutions.

It may be desirable to protect the photosensitive surfaces from contamination by dirt and dust during storage before being exposed and washed. Such protection may be accomplished by application of a flexible protective cover sheet to the side of the photocurable composition opposite that of the support. In addition, the photocurable compositions can sometimes be tacky, and in such case it may be desirable to apply a release film to the surface of the photosensitive layer before application of the coversheet. The release film may consist of a thin, flexible, water-dispersible polymeric film placed in intimate contact on the surface of the photocurable composition. Such release films are well known in the art.

Exposure and Development

Photosensitive articles comprising a support having a solid layer or surface comprising the invention photocurable compositions, e.g., solid flexographic printing plates, can be processed by well known techniques for imagewise exposure to actinic light. Preferably, the light should have a wavelength of about 230-450 microns. Exposure is through a negative placed between the light source and the photosensitive surface. Suitable sources of light include Type RS sunlamps, carbon arc lamps, xenon arc lamps, mercury vapor lamps, tungsten halide lamps, and the like.

Exposure periods depend upon the intensity of the actinic light, thickness of the plate, and the depth of the relief desired on the printing plate. Exposure periods of from 2 to 20 minutes are generally suitable.

After exposure and removal of the negative, the unexposed areas of the photosensitive surface can be developed in washout solutions as herein described. As noted, a preferred washout solution for plates containing the neutralized block polymer is a dilute aqueous surfactant solution. Plain water (preferably warm) is also useful (preferably with brushing). This feature is particularly advantageous in that it avoids problems of disposing of washout solutions containing organic solvents. Washout solvents recommended for developing block polymer-type plates which use unneutralized copolymers include toluene and tetrachloroethylene.

The following Examples illustrate without limiting the invention.

EXAMPLE 1

Preparation of Comparison ACBCA Block Copolymer

The poly(2-vinylpyridine-styrene-isoprene-styrene-2-vinylpyridine) ACBCA block copolymers were prepared by the sequential addition of isoprene, styrene and 2-vinylpyridine to a difunctional organolithium initiator in benzene.

The solvents and reagents were purified as follows. Benzene was distilled prior to use from a metallic sodium and benzophenone complex. The dark violet color indicated absence of protic and oxidative impurities. Isoprene was distilled twice under argon, once from calcium hydride and once from a dibutylmagnesium solution in heptane. Styrene was distilled twice under reduced pressure, once from calcium hydride and once more from dibutylmagnesium. 2-Vinylpyridine was distilled twice from calcium hydride under reduced pressure.

The polymerizations were carried out in a dry round-bottom flask flushed thoroughly with argon. The flask was equipped with a magnetic stirring system, an argon inlet, a reflux condenser and a rubber septa. All additions were carried out using a two-ended needle under dry argon. Utmost care was taken to see that the polymerization environment was free from oxygen and moisture.

The difunctional initiator was prepared by dissolving 0.12 cc of 1,3-diisopropenylbenzene (0.111 g, 0.7 mmole) in 500 ml of benzene, which was degassed with oxygen-free argon for 45 minutes. The benzene solution was titrated with 1.3M secbutyllithium until a yellow color persisted (0.3 ml of 1.3M secbutyllithium was required for the end point). Two equivalents more (1.4 mmoles) of the secbutyllithium was syringed in. The reaction between the precursor and secbutyllithium was allowed to proceed at 70° C. for 2 hours at which time the solution was dark red. It was cooled to 35° C. and 5-10 g of degassed isoprene was syringed in. The initial "seeding" was allowed to proceed at 35° C. for 30 minutes after which the rest of the isoprene (35.53 g, 0.52 mole total) was syringed in. The solution was heated at 50° C. for 1½ hours, at which stage the color was light red. Since the viscosity was high, the magnetic stirring system was switched to a more efficient mechanical stirring system. An aliquot of the isopropenyllithium was syringed out and quenched in methanol. This sample of polyisoprene was used for molecular weight determination of the starting block. Styrene (2.39 g, 0.02 mole) was added to the above solution at 50° C. and allowed to stir at 50° C. for 1 hour. The solution was dark yellow or orange at this stage. It was further cooled to 8° C. and 2-vinylpyridine was syringed in (16.46 g, 0.156 moles). The solution turned dark red immediately and was stirred at 8° C. for 30 minutes and terminated with 1-2 ml of degassed methanol. The polymer was characterized by $^1$H NMR and GPC. The composition of each monomer in the copolymer and the molecular weight are summarized in Table 1.

EXAMPLE 2

Preparation of CBA Block Copolymer

Purification of solvents and monomers was similar to Example 1. The reactor set-up was also similar.

Dry benzene (500 ml) was distilled in and degassed with oxygen-free argon for 45 minutes. Styrene (6.5 g, 0.06 mole) was syringed in. The above solution was titrated with 1.48M secbutyllithium until a yellow color persisted (took 0.35 ml) after which 0.38 ml of 1.48M (0.56 mmole) secbutyllithium was further added as the initiator. The solution turned dark yellow. Styrene was allowed to polymerize at 35° C. for 1½ hours. An aliquot was syringed out and terminated with methanol to measure the molecular weight of the starting block. Isoprene (52.65 g, 0.77 mole) was then syringed in. The solution turned light yellow and was allowed to stir at 40° C. for 2 hours. At this stage, once again a more efficient mechanical stirring system was employed. An aliquot of the diblock was syringed out for characterization by $^1$H NMR and GPC. The solution was cooled to 80° C. and 2-vinylpyridine (20.9 g, 0.2 mole) was syringed in. The dark red solution was stirred at 8° C. for 30 minutes and quenched with degassed methanol. The polymer was characterized by $^1$H NMR and GPC, results of which are summarized in Table 1.

EXAMPLE 3

Preparation of CBCA Block Copolymer

The procedure followed by CBCA synthesis was similar to CBA, i.e. sequential addition of styrene, isoprene, styrene and 2-vinylpyridine to secbutyllithium in benzene. As before, after isoprene polymerization, the magnetic stirring system was switched to a mechanical stirring and further styrene was added at 50° C. and stirred for 1 hour at 50° C. before addition of 2-vinylpyridine at 8° C. The weights and moles of each monomer added was as follows: styrene 1=4.62 g (0.044 mole), isoprene=44.06 g (0.65 mole), styrene 2=2.88 g (0.028 mole) 2-vinylpyridine=16.94 g (0.16 mole). Once again, the polymer was characterized by GPC and $^1$H NMR and the data summarized in Table 1.

EXAMPLE 4

Preparation of BA (Isoprene-2-Vinylpyridine Block Copolymer)

The diblock copolymer was prepared by a sequential addition of isoprene and and 2-vinylpyridine to secbutyllithium. Benzene (500 ml) was degassed as before with oxygen-free argon for 45 minutes. Secbutyllithium (0.8 ml of 1.3M, 1.04 mmoles) was syringed in followed by 63.13 g (0.93 moles) of isoprene. The solution was stirred at 35° C. for 15 minutes and 40° C. for 15 minutes. There was an exotherm to 45° C. The solution was stirred at 45° C. for 1½ hours more. As before the magnetic stirring system was switched to a mechanical for more efficient stirring. An aliquot of polyisoprene was syringed out for determination of the molecular weight of the starting block and the solution cooled to 8° C. At this stage 2-vinylpyridine (27.06 g, 0.26 mole) was added. Chain transfer to 2-vinylpyridine was noticed by the dark red color. The solution was stirred at 8° C. for 30 minutes and was quenched with degassed methanol. As before, the copolymer was characterized by $^1$H NMR and GPC. These results are also summarized in Table 1.

TABLE 1

| MULTIBLOCK COPOLYMERS OF A: 2-VINYLPYRIDINE, B: ISOPRENE, C: STYRENE | | | | | | | | | | | |
|---|---|---|---|---|---|---|---|---|---|---|---|
| | Isoprene | | Styrene | | 2-Vinyl-pyridine | | Weight %[1] | | | Isoprene Microstructure[1] | | Molecular Weight[2] |
| Example | g. | °C./hr | g. | °C./hr | g. | °C./hr | Isoprene | Styrene | 2VP | 1,4 | 3,4 | × 10³ |
| 1 | 35.53 | 50/1.5 | 2.39 | 50/1.0 | 16.46 | 8/0.5 | 69.0 | 7.0 | 24.0 | 92.6 | 7.4 | 500 |
| 2 | 52.65 | 40/2.0 | 6.5 | 35/1.5 | 20.9 | 8/0.5 | 64.0 | 10.6 | 25.4 | 91.9 | 8.1 | 126 |
| 3 | 44.06 | 40/2.0 | 7.5 | 35/1.5 | 16.94 | 8/0.5 | 64.0 | 9.6 | 26.4 | 92.0 | 8.0 | 88 |
| 4 | 63.13 | 45/1.5 | — | — | 27.06 | 8/0.5 | 73.4 | — | 26.6 | 92.1 | 7.9 | 191 |

Footnotes:
[1]From $^1$H NMR.
[2]From GPC of the starting block and $^1$H NMR of the final block copolymer.
[3]From GPC of the final block copolymers.

EXAMPLE 5

Formulation of the Multiblock Copolymers and Measurement of Their Physical Properties The multiblock copolymers described in Examples 1-4 were formulated with methacrylate monomers such as 1,6-hexanediol diacrylate ("HDDA") and 1,6-hexanediol dimethacrylate ("HDDMA"), a photoinitiator such as Irgacure ® 651 from Ciba-Geigy and an antioxidant such as Ionol (2,6-ditertbutyl-4-methyl(phenol)). The weight % (dry basis of each ingredient was as follows: 88.9% multiblock copolymer, 5% HDDA, 5% HDDMA, 1% Irgacure and 0.1% Ionol.

The solutions were then cast onto a mylar film, dried of solvents and cured by exposure to UV light. The physical properties were measured, results of which are listed in Table 2.

TABLE 2

PHYSICAL PROPERTIES OF THE UNMODIFIED MULTIBLOCK COPOLYMERS[1]

| Polymer of Example | Elongation % | Tensile PSI | Modulus PSI | Shore A° | Resilience % | Swell %[2] AQ | Swell %[2] SOLV |
|---|---|---|---|---|---|---|---|
| 1 | 538 | 1060 | 521 | 52 | 61 | 3 | 48 |
| 2 | 512 | 1410 | 757 | 56 | 57 | 4 | 48 |
| 3 | 539 | 1254 | 803 | 54 | 52 | 4 | 60 |
| 4 | 518 | 817 | 337 | 45 | 64 | 3 | 46 |

Footnotes:
[1]All polymers formulated as follows: 88.9% copolymer, 5% HDDA, 5% HDDMA, 1% Irgacure 651, 0.1% Ionol.
[2]Measured as weight gain on a 20 mil film in 24 hours at room temperature, in typical aqueous (AQ) and solvent (SOLV) based inks.

EXAMPLE 6

Neutralization of the Multiblock Copolymers and Their Formulations

The block copolymers of Examples 1–4 were neutralized with a strong acid such as hydrochloric acid or trifluoroacetic acid as follows. A calculated amount of the strong acid was dissolved in methanol and added dropwise to the above solution. A slight increase in viscosity was observed for most of the polymer solutions. The ACBCA solution of Example 1, however, showed a tremendous increase in viscosity and was almost gel-like. The reaction between the polymer and the acid solution was allowed to proceed at room temperature for 1 hour and further formulated as before.

The neutralized and formulated polymer solutions were cast onto mylar films as thin films (20 mls), dried and cured. The physicals of the thin films were then measured and are summarized in Table 3.

The neutralized and formulated solutions were also cast as thick plates (60 mils), dried at room temperature over several days and at 55° C. overnight. The plates were then imaged through a negative using UV light. The imaged thick plates were then washed in an acidic co-surfactant mix of 2% Rhodafac RS-710 and 2% Rhodasurf BC-840 (Rhone-Poulenc surfactants and specialties) at 55° C. to form flexographic relief plates. The wash rate of each is also listed in Table 3.

Physical Properties

The compositions and printing plates of the instant invention are characterized by certain highly desirable physical properties, as more fully described below.

The properties discussed below apply to plates of the invention, i.e., formulated with acrylates and photoinitiators, e.g. as described in Table 3.

Tensile Strength and Elongation

Tensile strength and elongation are related to the amount of energy that can be stored in the polymer prior to breaking or rupture and can be correlated to the ability of the plate to withstand chipping or fracture in use. High values of both properties are desired, e.g., about 300–1500 psi for tensile strength, and about 200–800% for elongation.

Modulus is related to the stiffness of the polymer and is a measure of the ability of the plate to conform to the ink roll or substrate during impression on press. Polymers with high modulus values will be very stiff and rigid and will not pick up or transfer ink well. Modulus values in the range of about 300–1000 psi are preferred.

Resilience is a measure of the resistance the polymer has towards deformation. A high resilience is desired to prevent areas of the plate from being compressed and not printing. Resilience values in the range of about 30–65% are generally desired.

Shore A Hardness Shore A hardness is similar to modulus in that a polymer with a high hardness value will not conform easily to the roll or substrate, and ink transfer will be poor. Values in the range of about 35°–70° are deemed desirable for flexographic printing application.

Herein, tensile strength, elongation, and modulus were determined by ASTM D 412; resilience by ASTM D 2632-79; and Shore A hardness by ASTM D 2240. All test plates were formulated with 5% hexane diol diacrylate, 5% hexane diol dimethacrylate, 1% Irgacure-651 ®, 2% BHT and balance multiblock polymer, optionally neutralized or quaternized, as the case may be. In actual use the plates would be about 67–250 mils thick.

In addition to such standard measurements as molecular weight, elongation, tensile strength, modulus and Shore A hardness, wash rate and swell behavior were also measured. Example 2 in Table 3 was tested for extrudability.

The wash rate was measured as amount of polymer dispersed per minute in an acidic surfactant system at 55° C. The rate should be 1.5 mils/min or greater. It appears that the wash rate is affected by both molecular weight and the weight percent of the end block, vinylpyridine.

Another important physical property is swell behavior upon exposure to ink. There are two types of inks, solvent-based inks which are used for printing on, for example, polyethylene bags and aqueous inks which are used mainly on paper goods. If the image on the plate is affected by the solvent, resolution or sharpness of the image will be lost. Ideally, the cured plate should swell

TABLE 3

PHYSICAL PROPERTIES[1] AND WASH RATES OF THE ACID NEUTRALIZED[2] MULTIBLOCK COPOLYMERS

| Polymer of Example | Elongation % | Tensile PSI | Modulus PSI | Shore A° | Resilience % | Wash Rate[3] mils/min | Swell %[4] AQ | Swell %[4] SOLV |
|---|---|---|---|---|---|---|---|---|
| 1 | 575 | 1021 | 472 | 51 | 58 | 1.5 | 32 | 45 |
| 2 | 449 | 1230 | 950 | 58 | 55 | 2.4 | 21 | 21 |
| 3 | 460 | 1040 | 711 | 56 | 52 | 2.0 | 35 | 22 |
| 4 | 418 | 509 | 325 | 47 | 63 | 1.7 | 31 | 20 |

Footnotes:
[1]All polymers formulated as follows: 88.9% acid-neutralized copolymers, 5% HDDA, 5% HDDMA, 1% Irgacure 651, 0.1% Ionol.
[2]All polymers neutralized 60 mole % of the vinylpyridine blocks with 37% aqueous hydrochloric acid diluted with methanol.
[3]In 2% Rhodafac RS 710 and 2% Rhodasurf BC 840 at 150° F. on 60 mils thick plates.
[4]Measured as weight gained on a 20 mil film in 24 hours at room temperature, in typical aqueous (AQ) and solvent (SOLV) based inks.

as little as possible upon exposure to the ink solvent. The polymers of the present invention are particularly good with aqueous inks.

Swell behavior is tested by taking a 100 mg sample of a cured 20 mil film such as those produced in Examples 5 and 6 and soaking it in solvent for 24 hours at ambient temperature. Swell is measured as percent weight gained.

In order to test extrudability, the melt flow index can be used. Melt flow is the technique used to determine the extrudability of the multiblock copolymers. As mentioned before, since the multiblock copolymers are a general class of thermoplastic elastomers they are elastic at room temperature but melt flow and could be extruded at elevated temperature, (>Tg of the plastic blocks). The extrudability is measured by the Melt Flow Index which is the grams ("g") of polymers per 10 minutes. ASTM D-1238 describes this technique. Normally a temperature of 125° C. is used. The CBA type of block copolymers show better melt flow characteristics than the ABA. For example, a quaternized ABA block copolymer shows a melt index of 3.28 gr/10 minutes. A corresponding neutralized CBA block copolymer shows a melt index of 14.26 gr/10 minutes, showing considerable improvement over the former.

Based on all the above information, Example 2 represents an overall favorable result. It was both cheaper and easier to make than a comparable ABA copolymer because a monofunctional initiator was used and lower viscosities resulted during synthesis and neutralization steps. It also had the best wash rate of the present group.

What is claimed is:

1. Method of preparing a photosensitive flexographic printing plate comprising coating a flexographic plate backing with a formulation comprising
   1) block polymer of the structure where A is A'B, CBA' or CBCA'

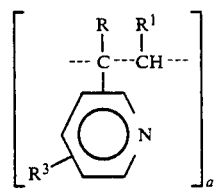

A' is

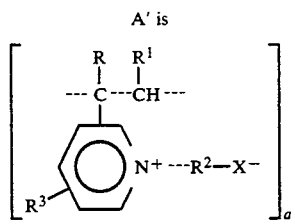

B is

C is

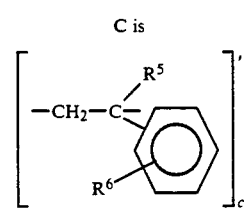

or

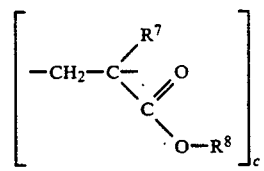

X is a leaving group;
R, $R^1$, $R^3$, $R^4$, $R^5$ and $R^6$ and $R^7$ are independently H or 1-8 carbon alkyl;
$R^2$ is H, 1-8 carbon alkyl, or aralkyl;
$R^8$ us 1-8 carbon alkyl;
a has a value in the range of about 50-5,000;
b has a value in the range of about 500-10,000;
c has a value in the range of about 25-500;
   2) photosensitive unsaturated compound; and
   3) photoinitiator.

2. The method of claim 1 where A is vinylpyridine, B is butadiene or isoprene and C is styrene.

3. The method of claim 1 wherein the compound has a molecular weight of about 75,000 to 500,000 and further includes about 20 to 40 weight percent A, 50 to 80 weight percent B, and at least 5 weight percent C.

4. A photosensitive flexographic printing plate comprising a backing and a quaternized block copolymer of the structure A'B, CBA' or CBCA', where A' is

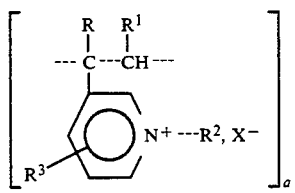

B is

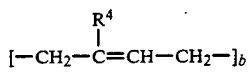

C is

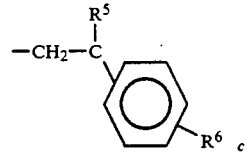

or

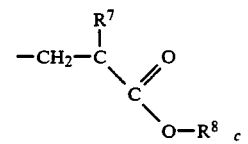

X is a leaving group;
R, $R^1$, $R^3$, $R^4$, $R^5$, $R^6$ and $R^7$ are independently H or 1-8 carbon-alkyl;
$R^2$ is H, 1-8 carbon alkyl, or aralkyl;
$R^8$ is $C_1$-$C_8$ alkyl;
a has a value in the range of about 50-5,000;
b has a value in the range of about 500-10,000; and c has a value in the range of about 25–500.

5. The flexographic printing plate of claim 4, wherein A is vinylpyridine, B is butadiene or isoprene and C is styrene.

6. The flexographic printing plate of claim 4, wherein the copolymer has a molecular weight of about 75,000 to 500,000 and further includes about 20 to 40 weight percent A, 50 to 80 percent B, and at least 5 weight percent C.

* * * * *